United States Patent [19]
Lin et al.

[11] Patent Number: 5,851,879
[45] Date of Patent: Dec. 22, 1998

[54] METHOD FOR FABRICATING COMPACT CONTACTLESS TRENCHED FLASH MEMORY CELL

[75] Inventors: Ruei-Ling Lin, Kao Hsiung; Ching-Hsiang Hsu; Gary Hong, both of Hsinchu, all of Taiwan

[73] Assignee: United Microelectronics Corporation, Taiwan

[21] Appl. No.: 786,907

[22] Filed: Jan. 22, 1997

[30] Foreign Application Priority Data

May 31, 1996 [TW] Taiwan ................................. 85106472

[51] Int. Cl.⁶ .................................................. H01L 21/336
[52] U.S. Cl. ............................................. 438/257; 438/264
[58] Field of Search .................................... 438/257, 261, 438/264, 265; 257/314

[56] References Cited

U.S. PATENT DOCUMENTS

| | | | |
|---|---|---|---|
| 5,472,893 | 12/1995 | Iida | 438/259 |
| 5,622,881 | 4/1997 | Acocella | 438/264 |
| 5,631,179 | 5/1997 | Sung | 438/264 |
| 5,679,591 | 10/1997 | Lin et al. | 437/43 |

OTHER PUBLICATIONS

"A Novel memory Cell Using Flash Array Contactless EPROM (FACE) Technology," 1990, IEDM, pp., 90–94.

"A NAND Structured Cell With A New Programming Technology For Highly Reliable 5-V Only Flash EEPROM," 1990, Symposium on VLSI Technology, pp., 129–130.

*Primary Examiner*—Jey Tsai
*Assistant Examiner*—Michael S. Lebentritt
*Attorney, Agent, or Firm*—Rabin & Champagne, P. C.

[57] ABSTRACT

A method for fabricating compact contactless trenched flash memory array for semiconductor EEPROM devices is disclosed. The flash memory array comprises a number of memory cell units. Each of the cell units comprises a body line, source and drain regions and a stacked gate constructed over a silicon wafer substrate. The source and drain regions are buried regions and the body line is isolated by the surrounding buried source/drain regions and trenches formed to cut deep down to the substrate of the wafer. The stacked gate includes a first polysilicon layer, an oxide-nitride-oxide configuration, a second polysilicon layer, a pad oxide layer and a nitride layer. The source and drain buried regions sandwiches the body line, and the stacked gate substantially sits directly atop the body line. The flash memory array is free from the serious problem of short channel effect.

36 Claims, 10 Drawing Sheets

METHOD FOR FABRICATING COMPACT CONTACTLESS TRENCHED FLASH MEMORY CELL

BACKGROUND OF THE INVENTION

1. Field of the Invention

The present invention relates in general to a process for fabricating the memory cell configuration of high-density semiconductor electrically-erasable programmable read-only memory (EEPROM) devices. In particular, the present invention relates to the process for fabricating compact contactless memory arrays for flash EEPROM devices. More particularly, the present invention relates to the process for fabricating the memory cell configuration of the compact contactless trenched flash array for the flash EEPROM device that allows the elimination of the short channel effect during hot carrier programming of the device.

2. Technical Background

Scaling down of the physical dimensions of the memory cell configuration for semiconductor flash EEPROM devices is indispensable for the upcoming next generation of high-density non-volatile memory devices. In the effort conducted for the scaling down of the basic memory cell units in these flash EEPROM devices, several configurations were proposed. For example, R. Kirisawa, S. Aritome, R. Nakauama, T. Endoh, R. Shirota and F. Masuoka proposed a NAND structure in their paper "A NAND structured cell with a new programming technology for highly reliable 5-V only flash EEPROM", 1990 Symposium on VLSI Technology, pp. 129–130. This NAND structure does need a special design on source and drain regions, which suffer from band-to-band tunneling, or even junction breakdown, during extraction of electrons from floating gates. This problem leads to unintentional damage to the thin oxide and difficulty in scaling the sources and drains of flash cells.

On the other hand, B. J. Woo, T. C. Ong, A. Gazio, C. Park, G. Atwood, M. Holler, S. Tam and S. Lai proposed another "FACE" structure in their paper "A novel memory cell using flash array contactless EPROM (FACE) Technology", 1990 IEDM, pp. 90–94. The basic structure, disclosed in this publication although featured by compact cells for the high-density flash EEPROM devices, suffers significant short channel effect during the hot carrier programming of the device. As is well known, the short channel effect in memory cell units will easily and likely lead to device punch-through. This problem represents a serious obstacle toward the down-scaling of the device memory cells in the progress of device miniaturization as the semiconductor fabrication technology advances.

SUMMARY OF THE INVENTION

It is therefore the primary object of the present invention to provide a process for fabricating a compact contactless trenched flash array, that has a configuration suitable for high-density memory cells, for EEPROM semiconductor devices.

It is another object of the present invention to provide a process for fabricating a compact contactless trenched flash array for EEPROM semiconductor devices. The array has a high-density memory cell array configuration without exhibiting the hot carrier programming short channel effect during the programming of the device.

It is still another object of the present invention to provide a process for fabricating compact contactless trenched flash array for EEPROM semiconductor devices. The array allows for better programming control over a smaller number of individual memory cells.

To achieve the above-identified objects, the present invention provides a process for fabricating a compact contactless trenched flash array for EEPROM semiconductor devices, that comprises the steps of first forming a P-well in the substrate of a wafer by $BF_2$ implantation and then performing thermal drive-in. Then a gate oxide layer is grown, and a first polysilicon layer is deposited and patterned for forming a deep trench having the bottom reaching down to the substrate. The substrate is then reoxidized to seal the surface of the substrate. A first BPSG (borophosphosilicate glass) layer is then deposited and then reflowed and etched back to obtain planarity. An oxide-nitride-oxide (ONO) layer is then formed, and a second polysilicon layer deposited with in-situ doping. Subsequently, a $WSi_x$ layer is formed, a pad oxide layer grown, and a nitride layer deposited. Then stacked gates of the flash array are formed by patterning into the formed oxide-nitride-oxide, second polysilicon, $WSi_x$, pad oxide and nitride layers and then a selective etching-back is conducted against the BPSG filled in the trenches, and the first polysilicon and gate oxide layers are then removed. $n^+$ source/drain regions are then formed and sidewall spacers for the stacked gates are deposited. A third polysilicon layer is then deposited and followed by the selective etching back to expose the stacked gate sidewall spacers, and the resistance in the third polysilicon layer is then reduced. The edges of the stacked gates and the surface of the third polysilicon layer are then sealed and covered with a second BPSG layer. Then contact openings are formed for the source/drain regions, and metal lines leading into the contact openings are formed for interconnecting the memory cells in the flash array with peripheral control circuits of the semiconductor EEPROM device.

BRIEF DESCRIPTION OF THE DRAWINGS

Other objects, features and advantages of the present invention will become apparent by way of the following detailed description of the preferred but non-limiting embodiment of a process for fabricating a flash memory array. The description is made with reference to the accompanying drawings showing various stages of the process, in which.

DETAILED DESCRIPTION OF THE PREFERRED EMBODIMENTS

Figure 1:
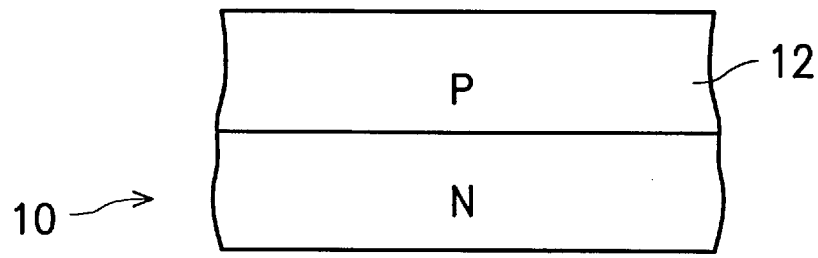
FIG. 1 is the cross-sectional view showing the silicon wafer at the completion of the formation of the P-well.

For the fabrication of the compact contactless flash array for the EEPROM device in accordance with a preferred process of the present invention, the starting material may be, for example, a <100> oriented n-type wafer. The process is described in the depicted procedural steps outlined below. The structural formation of the memory array is also described step-by-step with reference to the drawings. Note that the dimensions of the component configuration shown in the drawing for the description of the present invention are not drawn to the exact scale. Rather, the drawings are prepared only to schematically exemplify the characteristics of the present invention, without the intention to show the precise relative dimensions therein.

Step 1

Form a P-well in the substrate of a wafer either by implanting $BF_2$ and then performing thermal drive-in, or by epitaxial growth of a p-type layer on the wafer.

As seen in FIG. 1, a <100> n-type substrate 10 may be utilized as the basis for the construction of the memory device and is subjected to an ion implantation procedure implanting $BF_2$ ions under three energy levels of about 100/375/975 KeV. The $BF_2$ implantation procedure achieves a dose of about $5E12/cm^2$ so as to form a P-well 12 in the substrate 10. After the formation of the P-well 12, a thermal drive-in procedure may be employed to bring the implanted material further into the depth of the substrate 10. Alternatively, however, an epitaxially grown layer with a thickness of about 8,000 to 12,000 Å, having a resistance of about 3 Ω-cm as a result of boron doping, may also be used.

Step 2

Grow a gate oxide layer for the flash array, deposit a first polysilicon layer and pattern the layers to form deep trenches down to the n-type substrate, and reoxidize the device substrate in process to seal the surface thereof.

Figure 2A:
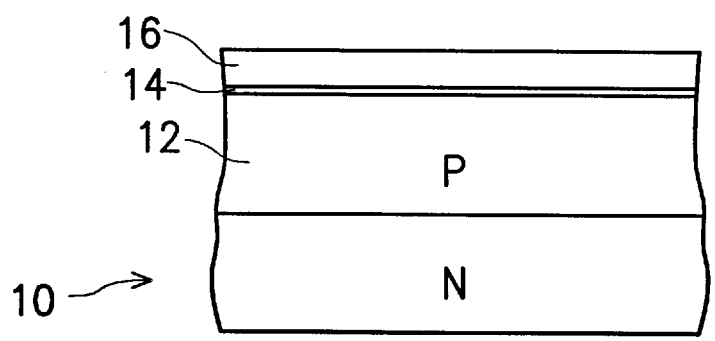
FIG. 2A is a cross-sectional view showing the formation of the first polysilicon deposition.
Figure 2B:
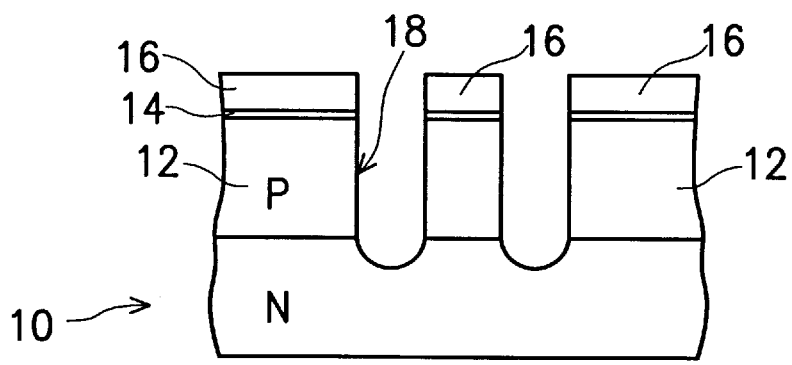
FIG. 2B is a cross-sectional view showing the formation of the deep trenches.
Figure 2C:
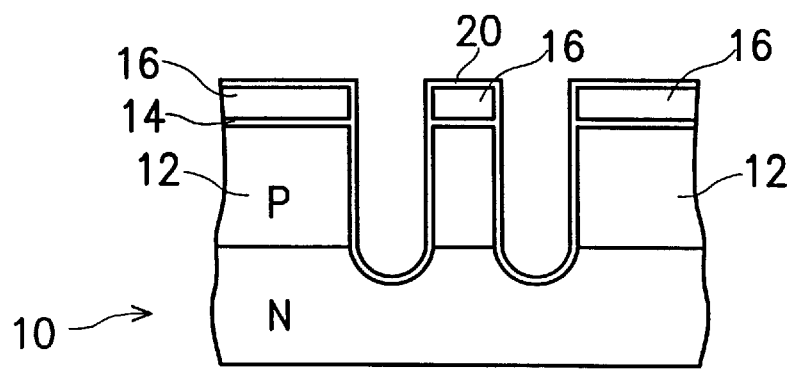
FIG. 2C is a cross-sectional view showing the formation of the sealing oxidation for the trenched substrate.

As then seen in FIGS. 2A to 2C, a gate oxide layer 14 for the flash array cells is then grown with deep trenches 18 formed in the substrate 10. The trenches 18 cut into the depth reaching into the substrate 10. This may be achieved by first allowing a gate oxide layer 14 having a thickness of about 60 to 100 Å to be grown over the surface of the P-well 12 in the substrate 10, followed by the deposition of a first polysilicon layer 16 having a thickness of about 1,500 Å, as shown in FIG. 2A. The first polysilicon layer 16 may then be patterned in a photolithography procedure that defines the locations of the trenches 18 to be cut substantially vertically into the device substrate 10. The deep trenches 18 are then formed, as shown in FIG. 2B, with the bottoms thereof cutting into the layer of the substrate 10. To allow the bottom of a trench 18 to cut into the substrate 10, the depth of the trenches 18 is about 15,000 to 20,000 Å measured from the level of the first polysilicon layer 16. Then, in FIG. 2C, a reoxidation procedure under a temperature of about 900° to 950° C. may then be implemented to form a seal 20 having a thickness of about 100 to 200 Å to the surface of the device substrate at this stage.

Step 3

Deposit a first BPSG (borophosphosilicate glass) layer on the surface of the device in process and then reflow and etch back selectively the BPSG layer to expose the poly -I layer.

Figure 3A:
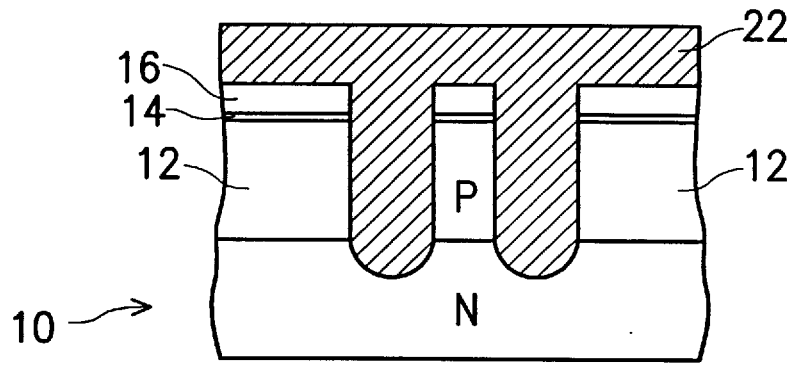
FIG. 3A is a cross-sectional view showing a layer of BPSG that covers the substrate completely and reflowed to achieve planarity.
Figure 3B:
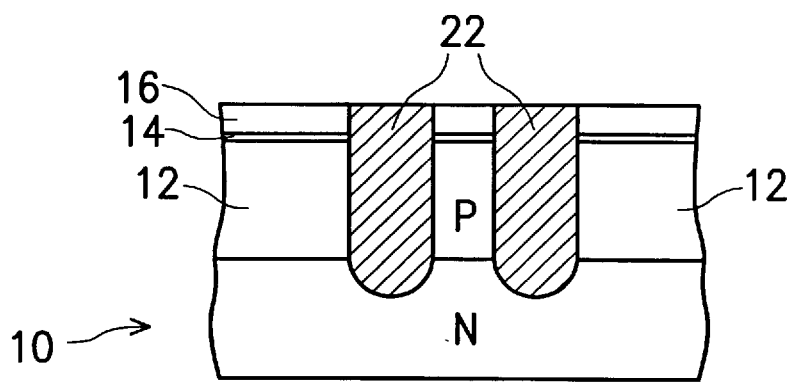
FIG. 3B is a cross-sectional view showing the BPSG layer etched back to expose the first polysilicon layers.

As seen in FIG. 3A, a layer of BPSG 22 with a thickness of about 2 to 3 μm is then deposited in, for example, a low temperature oxidation (LTO) procedure in order to cover the first polysilicon layer 16 completely, as well as filling into the trenches 18. Afterwards, the BPSG layer 22 is reflowed to achieve planarity and etched until the first polysilicon layer 16 is exposed, as seen in FIG. 3B.

Step 4

Form an oxide-nitride-oxide (ONO) layer on the device in process, deposit a second polysilicon layer thereon with in-situ dope, then subsequently form a $WSi_x$ layer, grow a pad oxide layer, and deposit a nitride layer.

Figure 4:
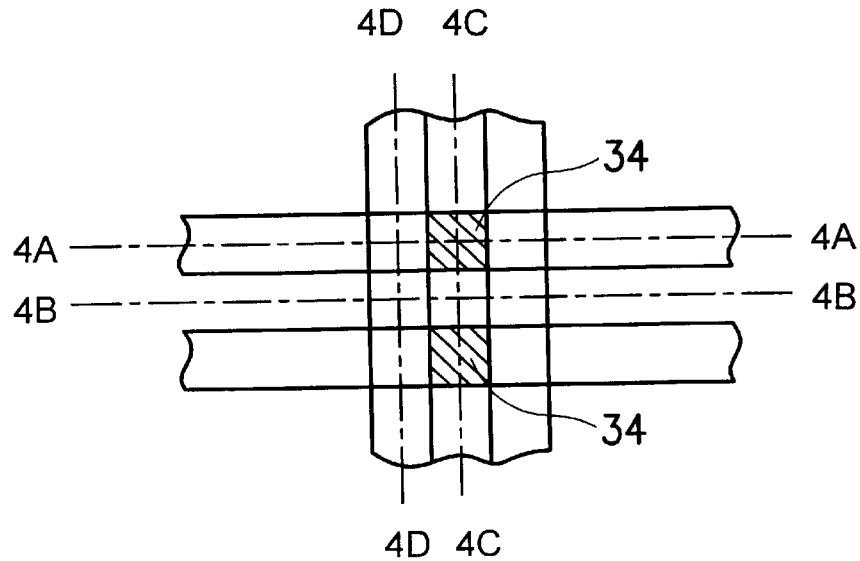
FIG. 4 is a top view of the wafer identifying the locations of the stacked gates.
Figure 4A:
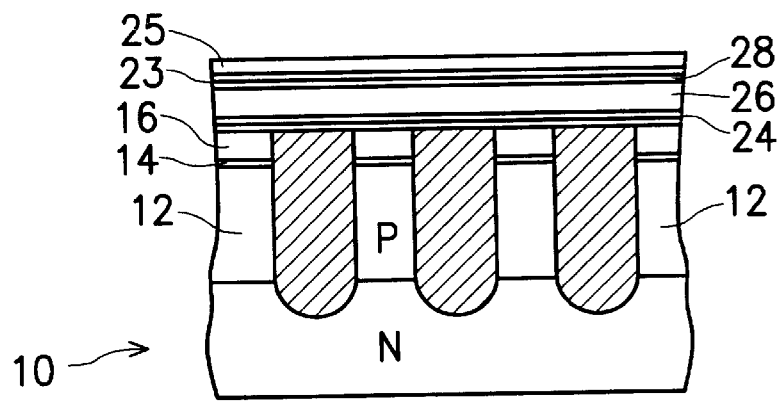
FIG. 4A is a cross-sectional view taken along the 4A—4A line in FIG. 4 showing the formation of the stacked gate layers.

As seen in FIG. 4A, an ONO layer 24 with a thickness of about 200 to 350 Å is formed by means of, for example, first reoxidizing the exposed first polysilicon layers 16 to form 100–150 Å oxide shown in FIG. 3B, followed by the deposition of a nitride layer having a thickness of about 50 to 100 Å, and then reoxidizing the deposited nitride subsequently to form the top oxide layer having a thickness of about 50 to 100 Å for the ONO configuration 24. A second polysilicon layer 26 having a thickness of about 1,500 Å is then deposited atop the ONO configuration 24 with arsenic in-situ doping that achieves a dose of about $5E15/cm^2$. This results in an n+ second polysilicon layer 26 as shown in FIG. 4A. Then, a $WSi_x$ layer 28 is formed further atop in order to reduce the resistance of the n+ second polysilicon layer 26. Afterwards, a layer of pad oxide 23 having a thickness of about 200 to 400 Å is grown, followed by the deposition of a nitride layer 25 having a thickness of about 500 to 1,000 Å. This nitride layer serves as a self-aligned mask for patterning the third polysilicon layer 46. With this layer, the third polysilicon layer 46 can be patterned without any additional photo masks. Note that the cross-sectional view of FIG. 4A is taken along the 4A—4A line in the top view FIG. 4 for the device configuration on the wafer up to this stage. This cross section reveals the location where the stacked gates 34 (FIG. 4) for the memory cells to be constructed subsequently.

Step 5

Define stacked gates for the flash array by patterning into the nitride, pad oxide, WSi$_x$, second polysilicon and oxide-nitride-oxide layers formed, selectively etching back the BPSG filled in the trenches, and then removing the first polysilicon and gate oxide layers.

Figure 4B:
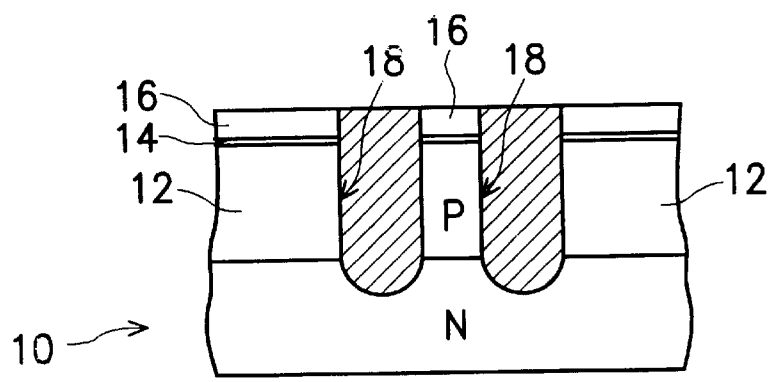
FIG. 4B is a cross-sectional view taken along the 4B—4B line in FIG. 4 showing the etching to expose the first polysilicon layer.

Stacked gates of the fabricated flash array are then defined by, for example, plasma etching to remove unwanted portions of the nitride, pad oxide, WSi$_x$, second polysilicon, ONO and first polysilicon layers 25, 23, 28, 26, 24 and 16 (referring again to FIG. 4A) respectively, until the first polysilicon layer 16 is exposed as is shown in FIG. 4B. Note that FIG. 4B is the cross-sectional view taken along the 4B—4B line in the top view of FIG. 4 that shows the wafer configuration at this fabrication stage. Since, as seen FIG. 4, the B—B line is away from any of the locations of the stacked gates 34 for the fabricated memory device. Therefore, all the nitride, pad oxide, WSi$_x$, second polysilicon and ONO layers 25, 23, 28, 26 and 24 respectively, that are not relevant to the areas defined by stacked gates 34, have all been removed in the plasma etching procedure described above. The BPSG layer 22 is directly exposed. The configuration of FIG. 4B is then further subjected to a selective etch back procedure against the BPSG 22 filling in the trenches 18. The extent of the portion of the BPSG 22 being removed is about 1,000 to 1,500 Å. Then, as seen in FIG. 4E, the unwanted first polysilicon layer 16 and the gate oxide layer 14 are further removed. Note here that FIG. 4E is taken along the same cross-sectional 4B—4B line as that of FIG. 4B at a stage of the process later than that illustrated in FIGS. 4A and 4B.

Step 6

Form n$^+$ source/drain regions for the flash array and deposit sidewall spacers for the stacked gates.

Figure 4C:
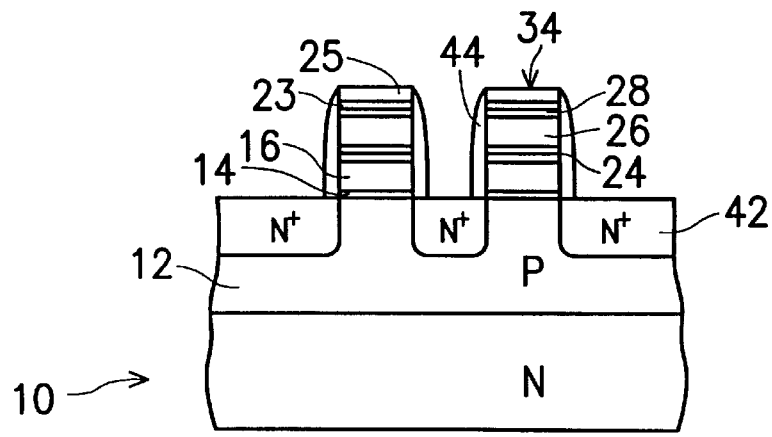
FIG. 4C is a cross-sectional view taken along the 4C—4C line in FIG. 4 showing the formation of the sidewall spacers for the stacked gates.
Figure 4D:
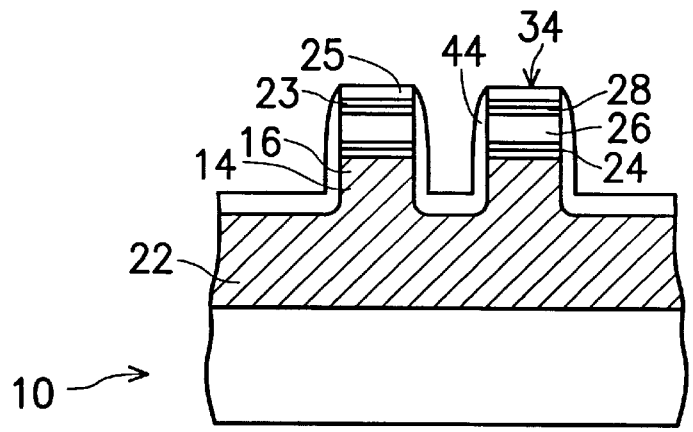
FIG. 4D is a cross-sectional view taken along the 4D—4D line in FIG. 4 showing another cross-sectional view of the stacked gates having sidewall spacers formed.
Figure 4E:
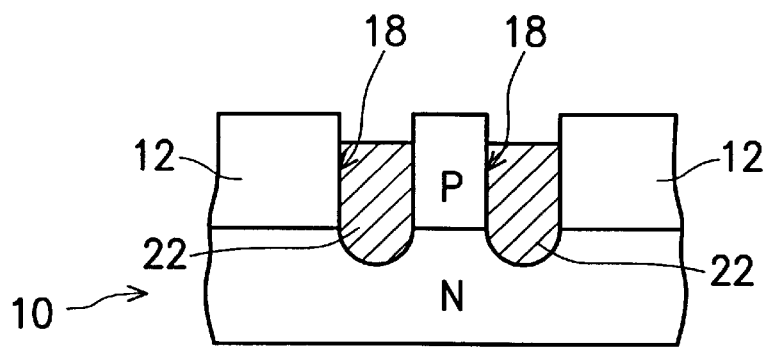
FIG. 4E is a cross-sectional view taken along the 4B—4B line in FIG. 4 showing a stage of the process later than that illustrated in FIG. 4B, after the BPSG is selectively etched and the first polysilicon layer removed.

As seen in FIG. 4C, which shows the cross-sectional view taken along the 4C—4C line in the top view of FIG. 4, the source/drain regions 42 for the flash array cell units are then formed by the implantation of the arsenic ions at an energy level of about 25 KeV, achieving a dose of about 3E15/cm$^2$. The arsenic implantation procedure is implemented utilizing the stacked gates 34 as a shielding mask. With simultaneous reference to FIG. 4A, FIG. 4C shows that each of the stacked gates 34 may comprise the thin oxide layer 14, the first polysilicon layer 16, the ONO configuration 24, the second polysilicon layer 26, the WSi$_x$ layer 28, the pad oxide layer 23 and the nitride layer 25 subsequently stacked above the gate oxide layer 14 that sits above the P-well 12 in the substrate 10, as is clearly seen in FIG. 4C. After the source/drain regions 42 are formed by arsenic implantation, sidewall spacers 44 may then be formed on the sidewalls of the stacked gates 34 by way of, for example, a low-temperature oxidation (LTO) procedure to form a spacer layer having a thickness of about 3,000 to 5,000 Å. The oxidized spacer layer 44 may then be subjected to, for example, a reactive ion etching (RIE) procedure to implement the etching-back until the n+ source/drain regions 42 expose their surface and the sidewall spacers 44 shaped. FIG. 4D shows the cross-sectional view of the device as taken along the 4D—4D line in the top view of FIG. 4. In a similar manner as in FIG. 4B, FIG. 4D shows the stacked layers of the stacked gates 34 in the region above the trenches 18 filled by BPSG 22.

Step 7

Deposit a third polysilicon layer followed by selective etching back to expose the stacked gate sidewall spacers, and then reduce the resistance in the formed third polysilicon layer.

Figure 5A:
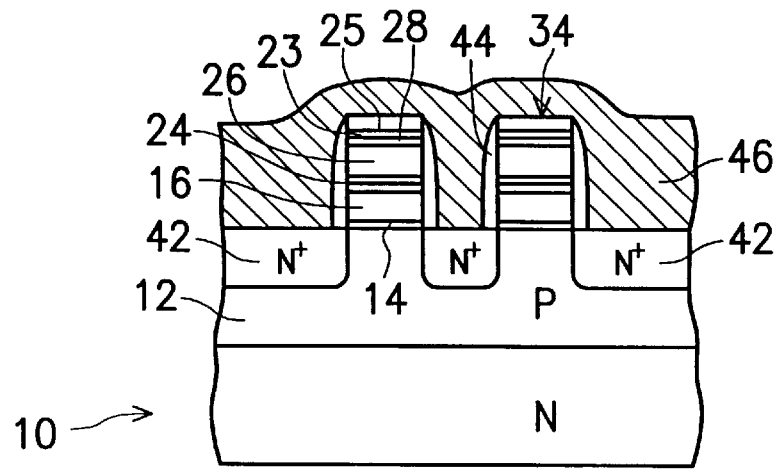
FIGS. 5A and 5B are cross-sectional views taken respectively along the 4A—4A and 4B—4B lines in FIG. 4 showing a stage of the process later than that illustrated in FIGS. 4A and 4B, after the deposition of the third polysilicon layer.
Figure 5B:
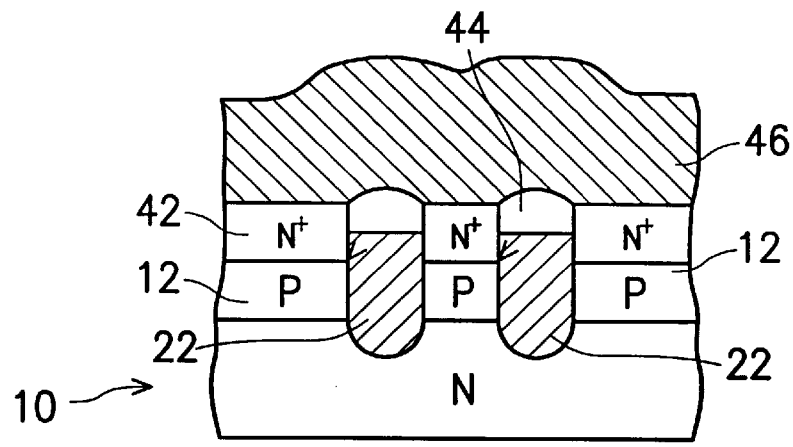
Figure 5C:
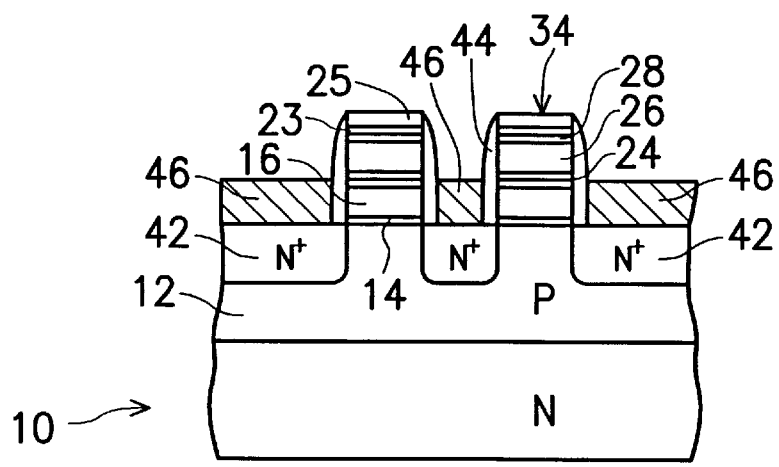
FIGS. 5C and 5D are cross-sectional views taken respectively along the 4C—4C and 4D—4D lines in FIG. 4 showing a stage of the process later than that illustrated in FIGS. 4C and 4D, after the third polysilicon layer being etched back and the n+ regions have been implanted.
Figure 5D:
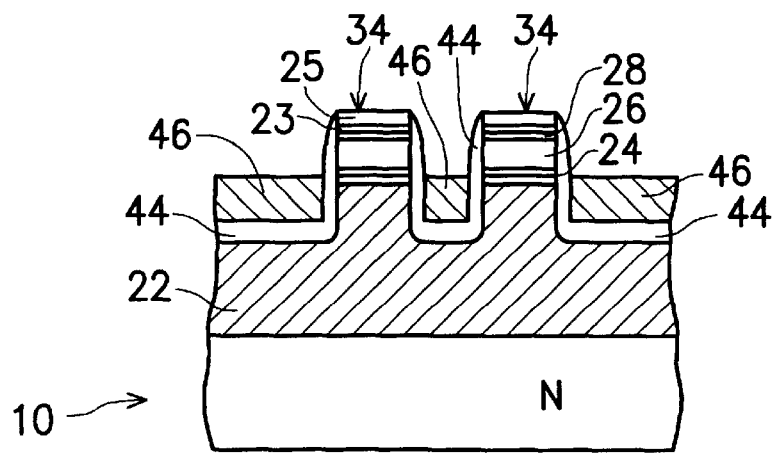

As seen in FIGS. 5A and 5B, a third polysilicon layer 46 having a thickness of about 3,000 to 4,000 Å is then deposited to cover the entire surface of the device substrate at this stage. Note that FIGS. 5A and 5B are cross-sectional views taken along the 4C—4C and 4B—4B lines respectively in the top view of FIG. 4, at a stage of the process later than that illustrated in FIGS. 4A and 4B. A selective etching back procedure is then implemented against the deposited third polysilicon layer 46 until the sidewall spacers 44 of the stacked gates 34 are exposed. FIGS. 5C and 5D show respectively the cross-sectional view taken along the 4C—4C and 4D—4D lines in the top view of FIG. 4 after the implementation of the selective etching back procedure. After the formation of the third polysilicon layers 46 as shown in FIGS. 5C and 5D, an ion implantation procedure is conducted to implant arsenic ions at an energy level of about 75 KeV to achieve a dose of about 5E15/cm$^2$. The arsenic implantation serves to reduce the resistance in the third polysilicon layer 46 formed.

Step 8

Seal the edges of the stacked gates and the surface of the third polysilicon layer and then cover them with a second BPSG layer.

The edges of the stacked gates and the surface of the third polysilicon layer are sealed by a 900°–950° C. thermal oxidation 47 of about 100–150 Å thickness. Then a second BPSG layer 48 having a thickness of about 12,000 to 16,000 Å is formed by deposition to cover the stacked gates 34 completely which is subsequently reflowed and etched back to achieve planarity. Each of the formed BPSG layers that covers the corresponding stacked gates has a thickness of about 8,000 to 12,000 Å that stacks atop the corresponding nitride layers 25 of the stacked gates 34 (FIGS. 6A, 6C and 6D).

Step 9

Form contact openings for the source/drain buried lines.

Figure 6:
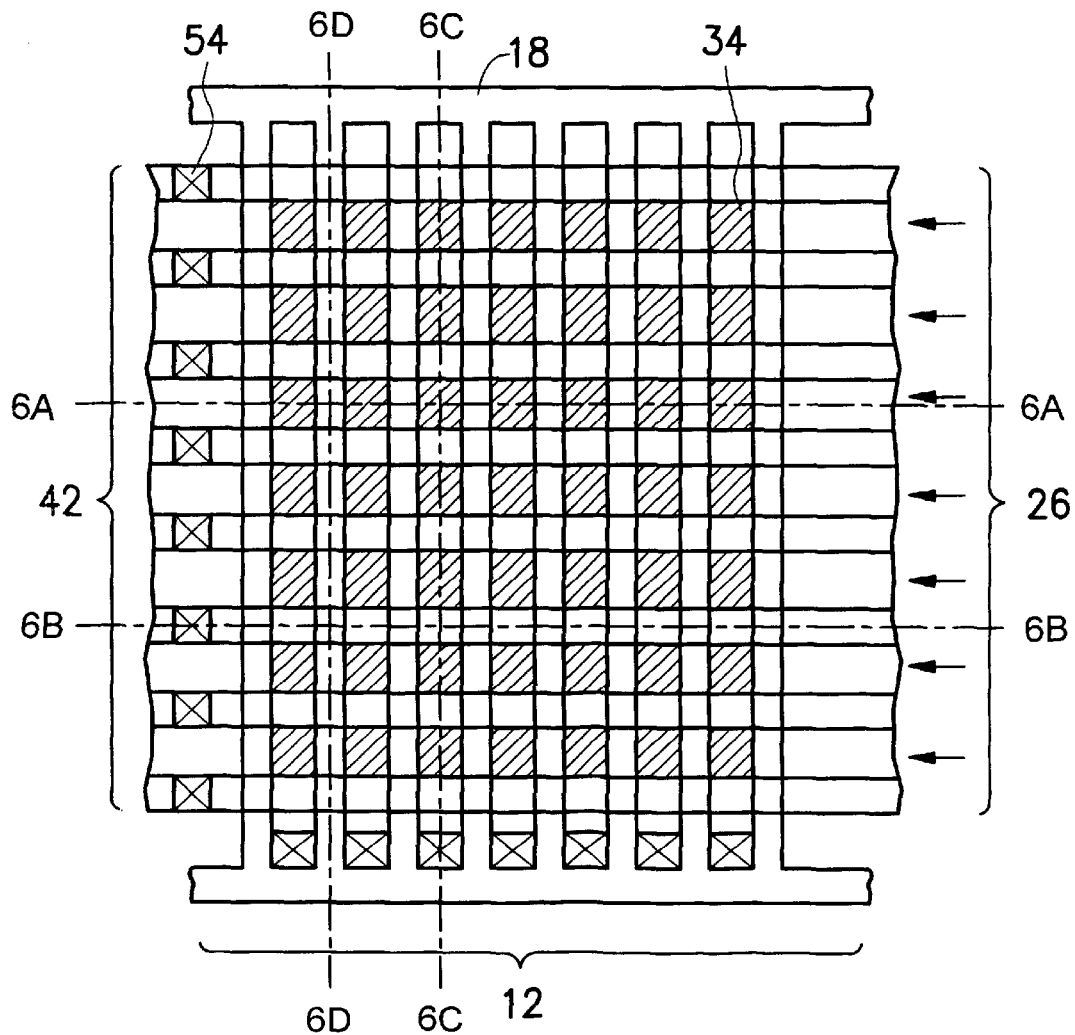
FIG. 6 schematically shows the top view of the wafer having a completely fabricated flash array for the device of the present invention.
Figure 6A:
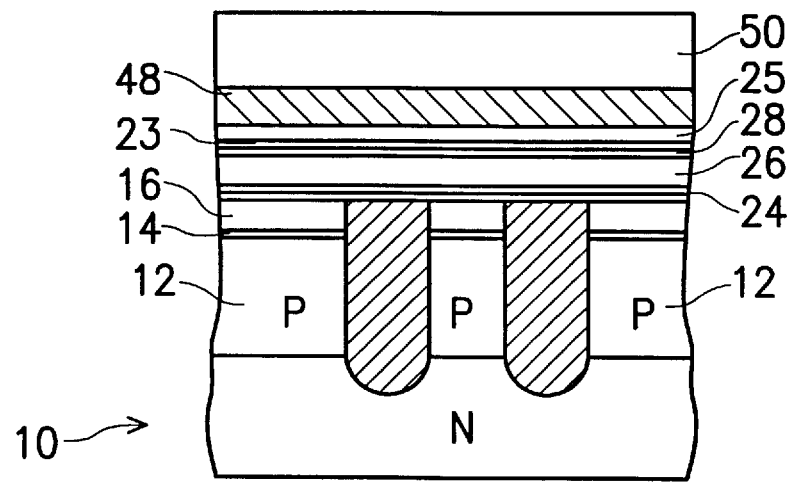
FIGS. 6A, 6B, 6C and 6D are cross-sectional views taken along the 6A—6A, 6B—6B, 6C—6C, 6D—6D lines respectively in the top view of the wafer shown in FIG. 6.
Figure 6B:
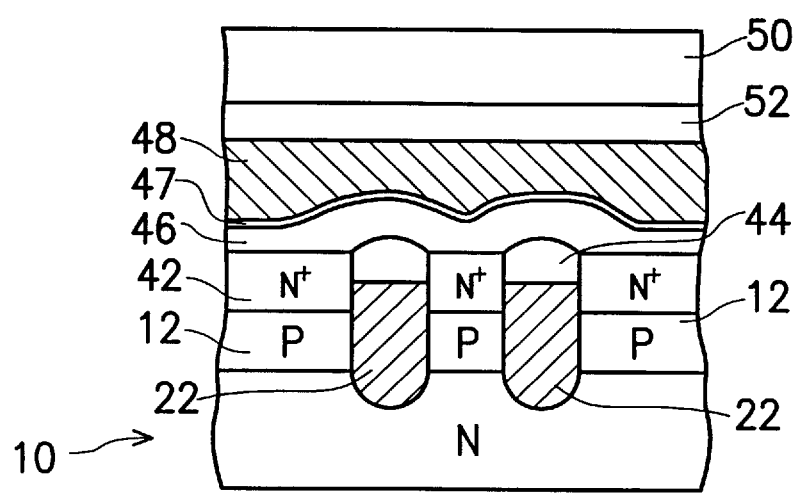
Figure 6C:
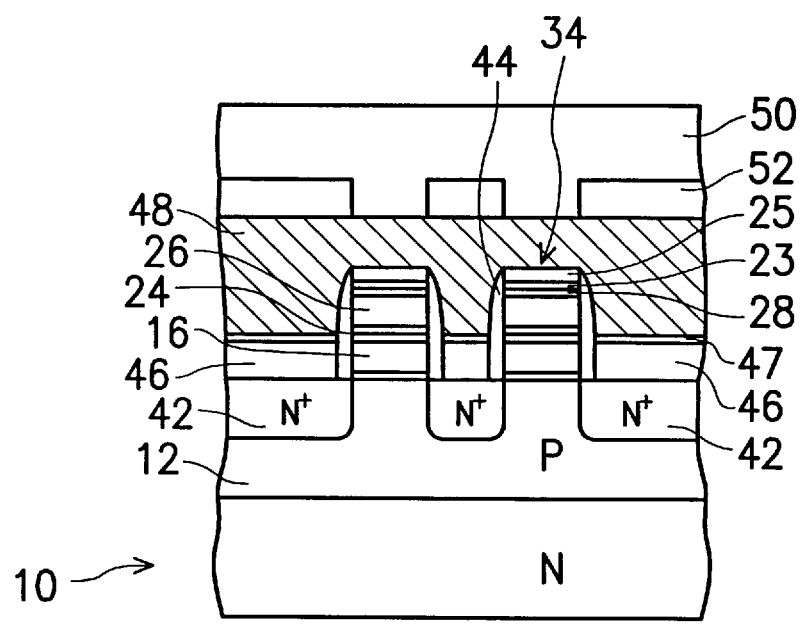
Figure 6D:
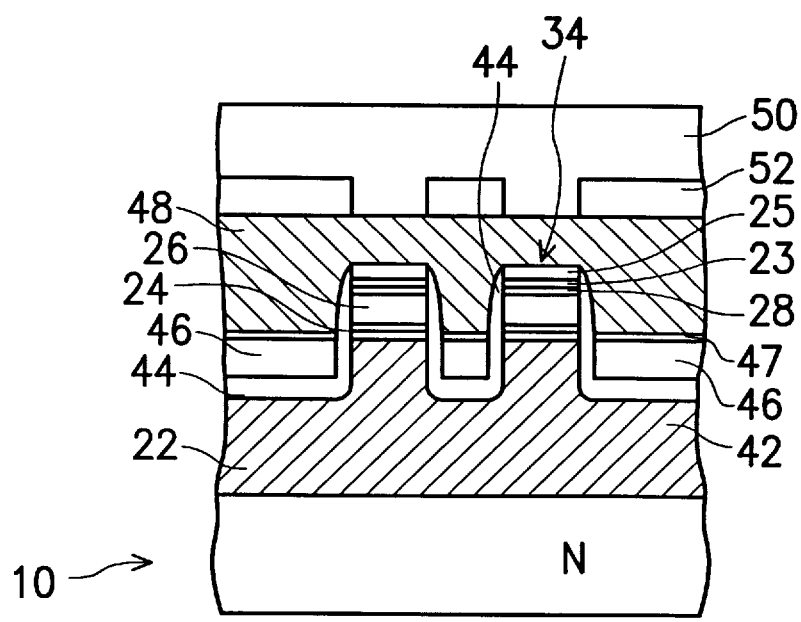

Contact openings for n+ source/drain buried-lines are then opened by etching at those suggested places 54 shown in FIG. 6, for example, for every 16 or more flash cells. Thus the subsequently low resistive metal lines 52 can efficiently reduce the resistance of the third polysilicon layer 46 by connection of both parallelly. Here low resistance enhances the read current of flash and thereby improves read speed. On the other hand, body lines may have their contact openings opened around the flash memory arrays.

Step 10

Form metal lines leading into the contact openings for interconnecting the memory cells in the flash array with relevant peripheral control circuits.

FIG. 6 schematically shows the top view of the wafer having a completely fabricated flash array for the device of the present invention. In the drawings, metal lines 52 may be defined to interconnect the device memory cells with peripheral control circuit via the contact openings. Finally, the devices may be protected by the passivation of the oxide layer 50. Note that in FIG. 6, hatches are employed to show the locations of the stacked gates.

This generally concludes the process for the fabrication of the compact contactless flash array for EEPROM semiconductor devices in accordance with the preferred embodiment of the present invention. To describe the structural configuration of the compact contactless flash array of the present invention in further detail, four cross-sectional views FIGS. 6A, 6B, 6C and 6D are taken along the 6A—6A, 6B—6B, 6C—6C and 6D—6D lines respectively in the top view of the fabricated wafer shown in FIG. 6. These four depicted cross-sectional views, which include the cross sections of the various characteristic portions of the flash array region, are helpful in the understanding of the characteristics of the structural configuration of the flash array of the present invention, as well as the functional characteristics it can achieve.

Figure 7:
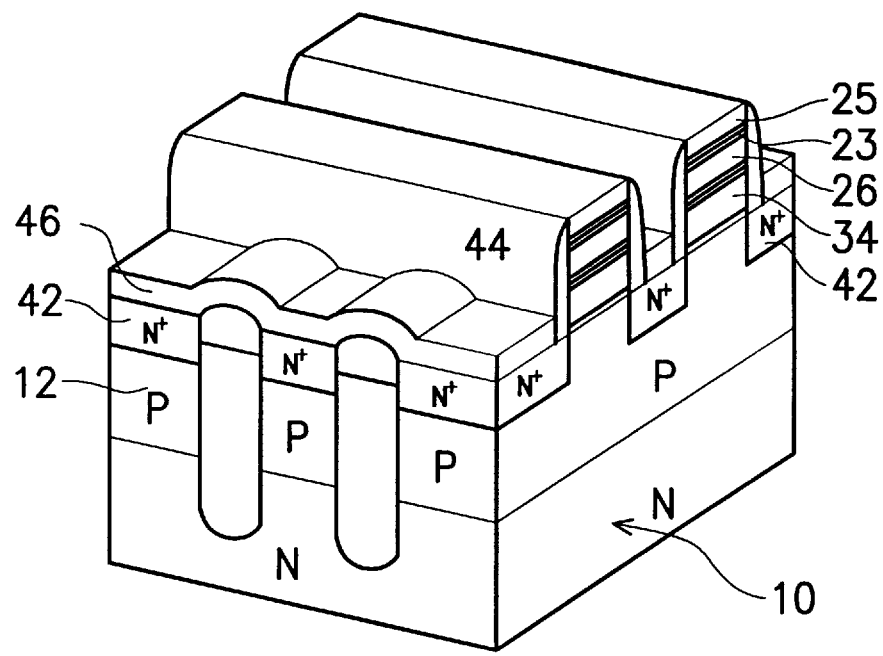
FIG. 7 is a perspective view of the fabricated flash array of the present invention showing the spatial characteristics of the device structural configuration.

In addition to the cross-sectional views FIGS. 6A, 6B, 6C and 6D, a perspective view of the fabricated flash array of the present invention is also shown in FIG. 7 to further demonstrate the spatial characteristics of the device structural configuration. With simultaneous reference to the drawings of FIG. 6, FIGS. 6A, 6B, 6C and 6D and FIG. 7, it would be helpful to identify the relative spatial relationships of the components for the construction of the flash array of the present invention. The description of FIGS. 6A–6D are not elaborated herein since the structural formation of the memory array of this invention has been discussed above in connection with the process steps. FIG. 7 illustrates all the structural elements, in a perspective view; that are described before and bear the same reference numerals.

Figure 8A:
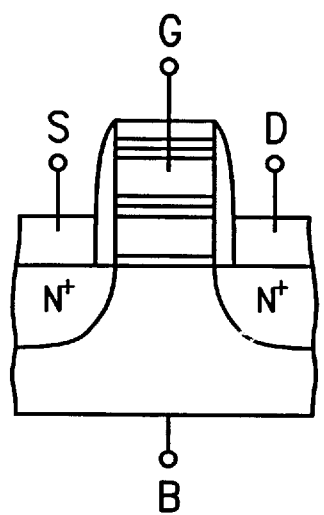
FIG. 8A schematically shows the structural configuration of one memory cell unit of the flash array of the present invention.
Figure 8B:
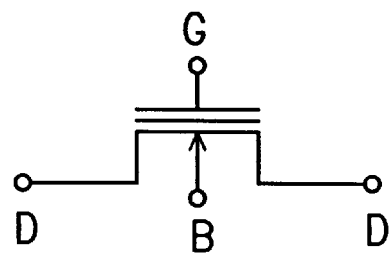
FIG. 8B shows the corresponding equivalent circuit symbol of the memory cell unit of the flash array of FIG. 8A.

Furthermore, FIG. 8A of the drawing schematically shows the structural configuration of one memory cell unit of the flash array of the present invention, while FIG. 8B shows the corresponding equivalent circuit symbol thereof. As seen in FIGS. 8A and 8B, each of the fabricated memory cell unit comprises a pair of n+ source/drain regions S and D respectively, a P-well body line B, and a stacked gate G that generally comprises a first polysilicon layer, an ONO configuration, a second polysilicon layer, a pad oxide layer and a nitride layer. The P-well body line B of each cell unit is surrounded and isolated by the deep trenches at both sides, and the stacked gate G directly sits atop the body line B.

Figure 9:
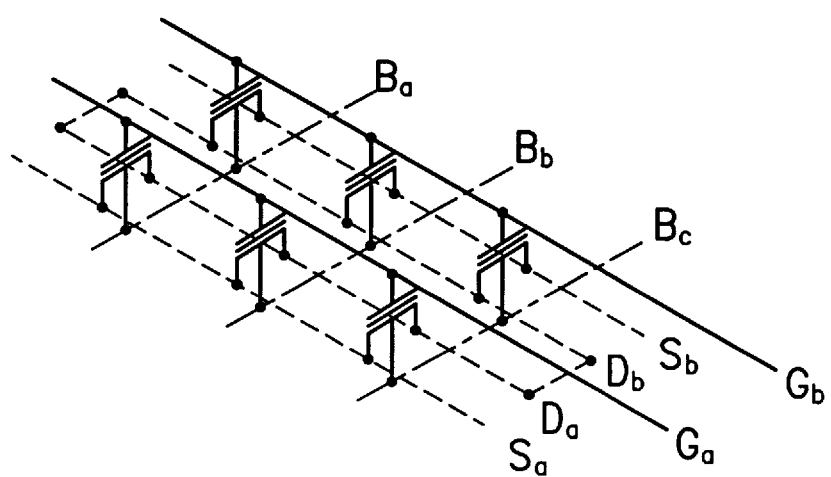
FIG. 9 schematically shows, in a perspective view, the connection of a group of memory cell units arranged in a portion of the flash array of the device of the present invention.

FIG. 9 schematically shows, in a perspective manner, the connection of a group of memory cell units arranged in a portion of the flash array of the device of the present invention. In FIG. 9, the circuit symbol of FIG. 8B has been employed to schematically exemplify the configuration of an array of memory cell units for the present invention. As noted, a set of memory cell units may be cascaded in a row (or column) that have their stacked gates G all tied together and triggered by a wordline signal $G_a$ (or, $G_b$). Similarly, another set of memory cell units may be cascaded in a column (or row) that have their P-well body lines B tied together and controlled by a body line signal $B_a$ (or, $B_b$ or $B_c$). In the arrangement shown in FIG. 9, each row (or column) of the memory cell units in the array may be directly addressed in either the read, erase or program mode via the selection of the attached metal line, such as the one exemplified by the metal line that controls the body line $B_a$ (or, $B_b$ or $B_c$) and the wordline $G_a$ (or $G_b$).

Thus, in the flash array configuration of the present invention, each of the compact cells may share its source/drain with adjacent cells. This allows for the flash memory cells of the present invention to make use of the F-N (Fowler-Nordheim) tunneling effect between the floating gate and the substrate to implement both the programming and erasing operation. Due to the use of trenches, P-well body lines of adjacent cells are isolated and work independently. By means of the double-sidewall technology, the buried n+ regions are interconnected with the anisotropic-etched ploy-III. By setting the voltage difference between substrate and gate, the cell programming and erasure can be performed, as is exemplified in the table below.

In terms of the applied electric potential at the control terminals of each of the memory cell units, Table 1 below lists such a control scheme for the read, erase and program of the selected number of memory cells, assuming the activation of the wordline $G_a$ and body line $B_b$ in the array of FIG. 9.

TABLE 1

|  | Program | Erase (Sector) | Read |
| --- | --- | --- | --- |
| $G_a$ | $V_{PP1}$ (13 V) | $V_{BB2}$ (−16 V) | $V_{CG}$ (4 V) |
| $G_b$ | 0 V | 0 V | 0 V |
| $B_a$ | 0 V | 0 V | $V_{BB3}$ (−7 V) |
| $B_b$ | $V_{BB1}$(−7 V) | 0 V | 0 V |
| $B_c$ | 0 V | 0 V | $V_{BB3}$ (−7 V) |
| $S_a$ | 0 V | $V_{PP2}$ (2 V) | 0 V |
| $D_a = D_b$ | 0 V | $V_{PP2}$ (2 V) | $V_D$ (1 V) |
| $S_b$ | 0 V | $V_{PP2}$ (2 V) | 0 V or floating |

In the table, one section may contain 256 K bits or more according to the length of n+ second polysilicon wordlines and that of body lines.

When compared to the flash array of the prior art, the present invention is advantageously distinguished in that the P-well body line of the memory cell units of the present invention is being isolated by the surrounding trenches and n-type substrate of the wafer. This allows the memory cells of the flash array of the present invention to be erased and programmed utilizing the body line and wordline in an F-N tunneling effect.

All prior art flash array memory cell configurations, on the other hand, would have to rely on the drain, source and wordline thereof in a hot carrier transport mode to implement the memory cell programming, although several of them may employ the source and wordline thereof in an F-N tunneling effect to implement its cell erase. In the continuous trend of the device dimensional scaling down for the improvement of memory density, the short channel effect, that is inevitable for the prior art devices which rely on hot carrier program/erase operations, constitutes a serious drawback when compared to the characteristics of the flash array of the present invention.

While the present invention has been described by way of example and in terms of preferred embodiments, it should be understood that the invention needs not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for fabricating a compact contactless trenched flash memory array of a plurality of memory cells for semiconductor EEPROM devices, said process comprising the steps of:

(a) forming a P-well in a wafer substrate;

(b) growing a gate oxide layer over the P-well in the substrate, depositing a first polysilicon layer on the gate oxide layer and patterning said first polysilicon layer for forming deep trenches having the bottom thereof reaching down to said substrate, and then reoxidizing the processed substrate to seal a surface thereof;

(c) depositing a first BPSG (borophosphosilicate glass) layer on said sealed substrate surface and then reflowing and etching back the first BPSG layer;

(d) subsequently forming, on said reflowed first BPSG layer and said first polysilicon layer, an ONO (oxide-nitride-oxide) layer, depositing a second polysilicon layer with in-situ dope, forming a $WSi_x$ layer, growing a pad oxide layer, and then depositing a nitride layer;

(e) forming stacked gates for said flash memory array by patterning into said formed nitride, pad oxide, WSi$_x$, second polysilicon, and ONO layers, selectively etching back said first BPSG layer filled in said trenches, and then removing partially said first polysilicon and gate oxide layers from the substrate after said patterning;

(f) forming n$^+$ source/drain regions in the substrate between said stacked gates, and depositing sidewall spacers for said stacked gates;

(g) depositing a third polysilicon layer over the substrate in process, followed by selectively etching back said third polysilicon layer to expose said stacked gate sidewall spacers, and then reducing resistance of said formed third polysilicon layer;

(h) sealing edges of said stacked gates and a surface of said third polysilicon layer and then covering the third polysilicon layer and exposed stacked gates with a second BPSG layer;

(i) forming contact openings for said source/drain regions; and (j) forming metal lines leading into said contact openings for interconnecting the memory cells in said flash memory array with peripheral control circuits of said semiconductor EEPROM devices.

2. The process of claim 1, wherein said step (a) comprises the step of epitaxially growing a layer in said substrate.

3. The process of claim 2, wherein said epitaxially grown layer has a thickness of about 8,000–12,000 Å, and is further doped with boron to have a resistance of about 3 Ω-cm.

4. The process of claim 1, wherein said BF$_2$ implantation is conducted under an energy levels of about 100 KeV, 375 KeV and 975 KeV to achieve a dose of about 5E12/cm$^2$.

5. The process of claim 1, wherein the gate oxide layer grown in said step (b) has a thickness of about 60 to 100 Å.

6. The process of claim 1, wherein the first polysilicon layer deposited in said step (b) has a thickness of about 1,500 Å.

7. The process of claim 1, wherein the patterning said first polysilicon layer in said step (b) is performed in a photolithography procedure for defining locations of said trenches to be cut substantially vertically into said substrate.

8. The process of claim 1, wherein said formed trenches in said substrate in said step (b) has a depth of about 15,000 to 20,000 Å measured from said first polysilicon layer.

9. The process of claim 1, wherein said reoxidizing in said step (b) is conducted at a temperature of about 900° to 950° C. for forming a seal having a thickness of about 100 to 200 Å to the surface of said substrate.

10. The process of claim 1, wherein said deposited first BPSG layer has a thickness of about 2 to 3 μm in a low temperature oxidation procedure for covering said first polysilicon layer completely.

11. The process of claim 1, wherein said reflowing and etching back of said first BPSG layer in said step (c) is performed until achieving a planarity and exposing said first polysilicon layer.

12. The process of claim 1, wherein, in said step (d), the ONO layer having a thickness of about 100 to 150 Å is formed by reoxidizing said first polysilicon layer, followed by depositing a nitride layer having a thickness of about 50 to 100 Å, and then reoxidizing said deposited nitride layer to form an oxide layer having a thickness of about 50 to 100 Å subsequently.

13. The process of claim 1, wherein the deposited second polysilicon layer in said step (d) has a thickness of about 1,500 Å atop said ONO layer with arsenic in-situ doping that achieves a dose of about 5E15/cm$^2$.

14. The process of claim 1, wherein the formed WSi$_x$ layer in said step (d) reduces the resistance of said second polysilicon layer.

15. The process of claim 1, wherein the grown pad oxide layer in said step (d) has a thickness of about 200 to 400 Å.

16. The process of claim 1, wherein the deposited nitride layer in said step (d) has a thickness of about 500 to 1,000 Å.

17. The process of claim 1, wherein the deposited nitride layer in said step (d) serves as a self-aligned shielding mask for patterning the third polysilicon layer in said step (g) to require no additional photo mask.

18. The process of claim 1, wherein said stacked gates of said fabricated flash memory array is defined by plasma etching to remove unwanted portions of the nitride, pad oxide, WSi$_x$, second polysilicon, and ONO respectively until said first polysilicon layer is exposed.

19. The process of claim 1, wherein the selective etching back of said substrate in said step (e) is conducted against said first BPSG layer filled in said trenches to remove a portion of said first BPSG layer, said removed portion being about 1,000 to 1,500 Å.

20. The process of claim 1, wherein said step (e) comprises removing unwanted portion of said first polysilicon layer and gate oxide layer.

21. The process of claim 1, wherein said step (f) further comprises implanting arsenic ions at an energy level of about 25 KeV, thereby achieving a dose of about 3E15/cm$^2$ utilizing said stacked gates as a shielding mask.

22. The process of claim 1, wherein, in said step (f), the sidewall spacers are deposited on sidewalls of said stacked gates by a low-temperature oxidation procedure, said sidewall spacers having a thickness of about 3,000 to 5,000 Å.

23. The process of claim 1, wherein said step (f) further comprises subjecting said sidewall spacers to a reactive ion etching procedure to implement an etching-back until said n+ source/drain regions expose their surfaces and said sidewall spacers are shaped.

24. The process of claim 1, wherein, in said step (g), said deposited third polysilicon layer has a thickness of about 3,000 to 4,000 Å and covers the entire surface of said substrate in process.

25. The process of claim 1, wherein said selective etching-back of said deposited third polysilicon layer in said step (g) is conducted until said sidewall spacers of said stacked gates are exposed.

26. The process of claim 24, wherein said step (g) further comprises conducting an ion implantation procedure to implant arsenic ions at an energy level of about 75 KeV to achieve a dose of about 5E15/cm$^2$.

27. The process of claim 1, wherein said step (h) comprises sealing the edges of said stacked gates and the surface of said third polysilicon layer by an oxide layer having a thickness of about 100 to 150 Å formed by oxidation at a temperature of about 900° to 950° C.

28. The process of claim 21, wherein said second BPSG layer deposited in said step (h) has a thickness of about 12,000 to 16,000 Å to cover said stacked gates completely, said step (h) further comprises subsequently reflowing and etching back said second BPSG layer to achieve a planarity such that said second BPSG layer has a thickness of about 8,000 to 12,000 Å that stacks atop the corresponding nitride layers of said stacked gates.

29. The process of claim 1, wherein said step (i) further comprises opening said contact openings for said n$^+$ source/drain regions by etching for a plurality of flash cells.

30. The process of claim 1, wherein said step (i) further comprises opening said contact openings for said n$^+$ source/drain regions by etching for every 16 or more flash cells.

31. The process of claim 1, wherein said step (i) further comprises opening said contact openings for forming body lines around said memory cells of said flash memory array.

32. The process of claim 1, wherein said step (j) further comprises forming a protective passivation layer atop the flash memory array.

33. A process of forming an EEPROM having stacked gates, comprising:

forming stacked gates on a substrate;

forming deep reoxidized trenches and source and drain layers separating the stacked gates, the source and drain layers being buried in the substrate;

forming sidewall spacers on sidewalls of the stacked gates;

depositing a polysilicon layer over the substrate, including in the deep reoxidized trenches, so as to cover the sidewall spacers;

etching back the further polysilicon layer to expose the sidewall spacers; and covering the etched back further polysilicon layer and the exposed sidewall spacers with a BPSG layer.

34. A process according to claim 33, wherein the polysilicon layer is a third polysilicon layer, and wherein each stacked gate includes a first polysilicon layer, an oxide-nitride-oxide configuration, a second polysilicon layer, a pad oxide layer, and a nitride layer.

35. A process for fabricating a compact contactless trenched flash memory array of memory cells for semiconductor EEPROM devices, the process comprising:

forming a P-well in a wafer substrate;

growing a gate oxide layer over the P-well in the substrate, depositing a polysilicon layer on the gate oxide layer;

patterning the polysilicon layer for forming deep trenches having bottoms thereof reaching the substrate, reoxidizing the substrate after the patterning to seal a surface of the substrate to obtain deep reoxidized trenches;

forming stacked gates for the flash memory array separated by the deep reoxidized trenches;

forming n+ source/drain regions in the substrate between the stacked gates, and depositing sidewall spacers for the stacked gates;

depositing a further polysilicon layer over the substrate, and then selectively etching back the further polysilicon layer to expose the stacked gate sidewall spacers; and covering the further polysilicon layer and exposed stacked gates with a BPSG layer.

36. A process according to claim 35, wherein the polysilicon layer is a first polysilicon layer and the further polysilicon layer is a third polysilicon layer, and wherein the stacked gates include portions of the first polysilicon layer remaining after the patterning of the first polysilicon layer, an oxide-nitride-oxide configuration, a second polysilicon layer, a pad oxide layer, and a nitride layer.

* * * * *